United States Patent
Ho et al.

(10) Patent No.: US 6,845,052 B1
(45) Date of Patent: Jan. 18, 2005

(54) DUAL REFERENCE CELL SENSING SCHEME FOR NON-VOLATILE MEMORY

(75) Inventors: Hsin-Yi Ho, Hsinchu (TW); Nai-Ping Kuo, Hsinchu (TW); Chun-Hsiung Hung, Hsinchu (TW); Gin-Liang Chen, Hsinchu (TW); Wen-Chiao Ho, Hsinchu (TW); Ho-Chun Liou, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/250,040

(22) Filed: May 30, 2003

(51) Int. Cl.[7] ............................................... G11C 7/02
(52) U.S. Cl. ......................................... 365/210; 365/207
(58) Field of Search ............................ 365/210, 189.08, 365/207, 196

(56) References Cited

U.S. PATENT DOCUMENTS

| | | | | |
|---|---|---|---|---|
| 5,321,655 A | * | 6/1994 | Iwahashi et al. | 365/185.21 |
| 5,594,691 A | * | 1/1997 | Bashir | 365/185.03 |

* cited by examiner

*Primary Examiner*—Thong Q. Le
(74) *Attorney, Agent, or Firm*—Jianq Chyun IP Office (57) ABSTRACT

The present invention provides a dual reference cell sensing scheme for non-volatile memory. A high voltage reference cell and a low voltage reference cell are individually coupled to two sense amplifiers for providing two distinct reference voltages for comparison against the memory cell voltage. The output of the two sense amplifiers is further connected to a second stage sense amplifier to determine the status of the memory. The dual reference cell sensing scheme provides an increased sensing window which increases performance under low voltage application. The dual reference cell sensing scheme can be implemented by either voltage-based, current-based, or ground.

20 Claims, 6 Drawing Sheets

DUAL REFERENCE CELL SENSING SCHEME FOR NON-VOLATILE MEMORY

BACKGROUND OF INVENTION

1. Field of the Invention

The present invention is generally related to nonvolatile memory device, and more particularly, to a dual reference cell sensing scheme for nonvolatile memory.

2. Description of Related Art

Non-volatile memory devices are memory devices that can store data even when voltage is cut off. These nonvolatile memory devices are particularly useful in portable devices for storing operating system as well as user data. Recently, high attention and heavy research have been given to non-volatile memory because of its adaptability and flexibility. The speed of the memory is of great importance for non-volatile memory.

Erasable programmable read only memories (EPROMs) are a fast growing class of non-volatile storage integrated circuits because they have the ability of electrically programming and reading a memory cell in the chip. EPROMs frequently use memory cells that have electrically isolated gates commonly referred to as floating gates. These floating gates are most often completely surrounded by oxide and formed from a polycrystalline silicon (i.e., polysilicon) layer. Information is stored in the memory cells or devices in the form of a charge on the floating gate. Charges are transported to the floating gates by a variety of mechanisms such as avalanche injection, channel injection, tunneling, etc., depending on the construction of the cells. These cells are generally erased by exposing the array to ultraviolet (UV) radiation.

Electrically erasable and programmable read only memories (EERPOMs) are both electrically erasable and electrically programmable. Charges are placed onto and removed from a floating gate via tunneling of electrons through a thin gate oxide region formed over the substrate. In other instances, charges are removed through an upper control electrode.

More recently, a new category of electrically erasable devices has emerged, and the devices are frequently referred to as "flash" EPROMs or "flash" EEPROMs. In these memories, memory cells are erased electrically, whereas the cells themselves include only a single device per cell. Also, erasing of the entire array or a block of individual memory cells may be accomplished.

In accomplishing erase and program verification, a variety of sense amplifiers are used in the prior art to sense the state of the memory cells. To accomplish verification by sensing, a current is generated by the memory cell being verified by application of a gate potential to its word line. The current is compared to a current from a reference cell by the sense amplifier. Typically, EPROMs employ a column of UV-erased cells, identical in structure to the memory cells, which act as these reference cells. The sense amplifier determines whether the memory cell being verified is drawing more or less current than the reference cell which is weighted in some relationship to the memory cell. In doing so, the sense amplifier verifies the programmed state of the memory cell. The following equation defines the change in potential for a single cell reference scheme:

$$\Delta V_{single} = V_{ref(H)} - V_{cell} \text{ or } \Delta V_{single} = V_{cell} - V_{ref(L)} \quad (1)$$

The reading speed of the non-volatile memory depends on the sensing scheme of the sense amplifiers. Prior art uses a single cell reference scheme for the sense amplifiers and therefore it is not suitable for low voltage application due to the unstable reference voltage and a narrow sensing window of the single cell reference scheme. Furthermore the dummy cell method and trimming method used in the prior art for setting the reference cell are expensive and inaccurate. Therefore, there is a need for a non-volatile memory with high speed read sped.

SUMMARY OF INVENTION

According to one object of the present invention, a high read speed non-volatile memory is provided.

According to another object of the present invention, the sensing window of the non-volatile memory is increased.

According to another object of the present invention, the reference voltage can be easily set.

According to another object of the present invention, the noise immunity of the non-volatile memory is increased.

The present invention provides a dual cell reference scheme for non-volatile memory. Two reference cells are used in conjunction with two sense amplifiers for providing sensing amplification. One of the reference cell is a high-voltage (HVT) cell and the other one is a (LVT) cell, the HVT cell can also be ground, floating ground, or reference current source and the LVT cell can be a fresh cell and a reference current source. The HVT cell and LVT cell are individually coupled to a sense amplifier and they are both further connected to a common sense amplifier for determining the status of the memory cell. The equation that shows the change in the potential for a dual reference cell sensing scheme:

$$\Delta V_{dual} = (V_{ref(H)} - V_{cell}) + (V_{cell} - V_{ref(L)}) = 2\Delta V_{single} \quad (2)$$

Equation (2) shows that the change in voltage for the dual reference cell sensing scheme is double of that of the single reference cell sensing scheme. The increase in $\Delta V_{dual}$ expands the sensing window by providing a large input signal difference for sensing. The increase in $\Delta V_{dual}$ significantly increases the read speed of the non-volatile memory. Furthermore due to the expanded sensing window, the accuracy under low voltage application is greatly improved. In a low voltage application, the sensing window is very narrow and therefore the read speed and accuracy is limited. The dual reference cell sensing scheme also has no dead zone which greatly improves performance.

The reference void is easily set because of the $\Delta V_{dual}$ and therefore the reference voltage needs not to be very accurately determined being in a midway between the high and the low voltage. The region for determining whether it belongs to high or low voltage is distinctly distinguished because two reference cells are used and therefore the two reference cells can take different values if required. The initial unaltered reference voltage of the manufactured memory can be used as the reference voltage to reduce cost in this dual reference cell sensing scheme.

The dual reference cell sensing scheme of the present invention is applicable to any non-volatile memory such as EEPROM, EPROM, MASK ROM, FLASH ROM or combination of volatile memory and non-volatile memory.

The present invention also provides a method for sensing a non-volatile memory with dual reference cells, comprising first providing first sense amplifier, a second sense amplifier, and a third sense amplifier, wherein each of the sense amplifiers has a first polarity input terminal and a send polarity input terminal. Then, a first voltage reference signal is applied to the first polarity input terminal of the first sense amplifier, and a second voltage reference signal is applied to the second polarity input terminal of the second sense amplifier. A cell reference signal, which is to be sensed, is applied to the second polarity input terminal of the first sense amplifier and the first polarity input terminal of the second sense amplifier. And, outputs of the first sense amplifier and the second sense amplifier are input to the third sense amplifier.

In the foregoing method, the fist polarity input terminal is a negative input terminal and the second polarity input terminal is a positive input terminal. The first polarity input terminal is a positive input terminal and the second polarity input terminal is a negative input terminal. The fist voltage reference signal is from a high voltage reference cell. The high voltage reference cell can be a ground voltage, a floating ground, or a reference current source. The second voltage reference signal is from a low voltage reference cell.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
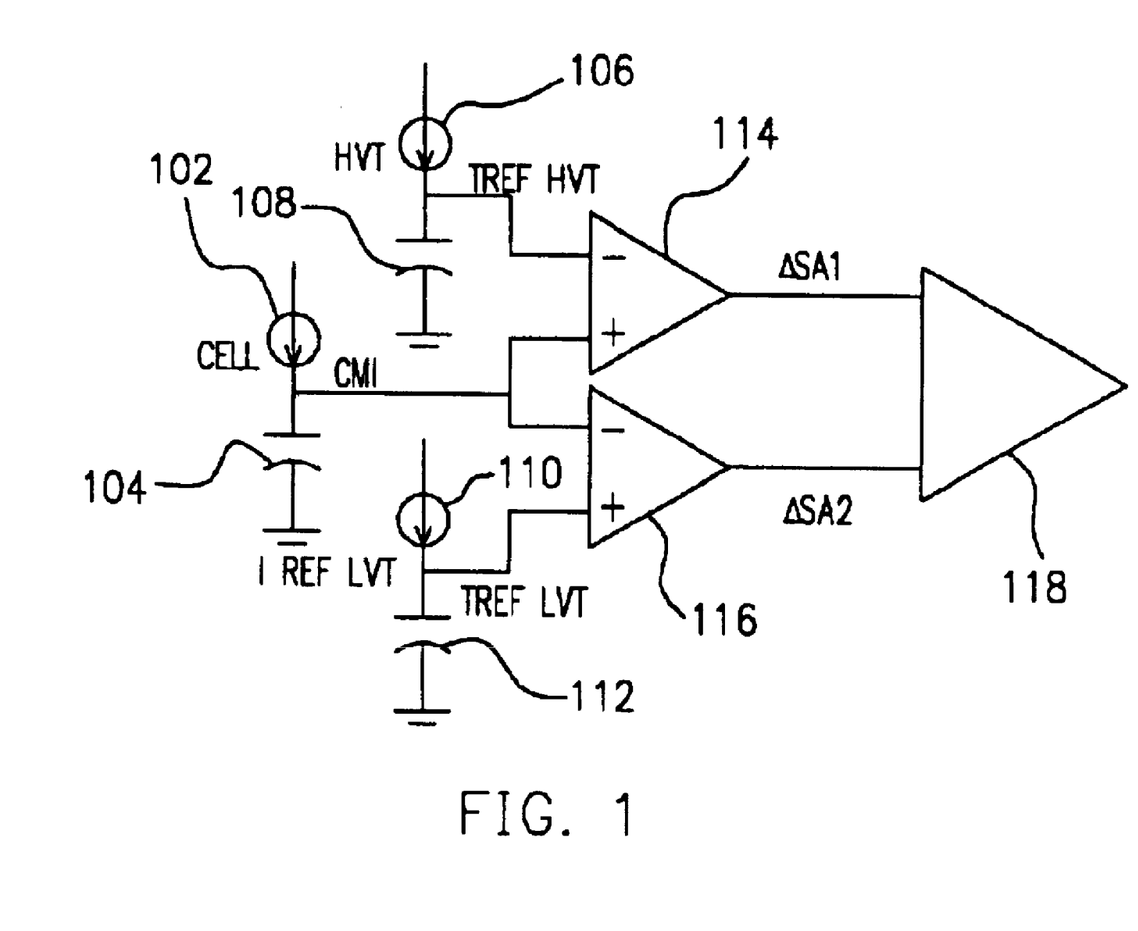
FIG. 1 is a schematic diagram of the current-based dual reference cell sensing scheme according to a preferred embodiment of the present invention.

FIG. 1 shows a dual reference cell sensing scheme of a preferred embodiment of the present invention. Reference numerals 102, 106, and 110 represent current sources from a memory cell (CELL in the FIG. 1), a high voltage (HVT) reference cell, and a low voltage (LVT) reference cell respectively. The current sources 102, 106, and 110 are connected to capacitors 104, 108, and 112 respectively. The capacitors 104, 108, and 112 are used for holding the charges from the current sources 102, 106, and 108 until it reaches a required level. The current source 102 of the memory cell sends out a signal CMI through a common node to a positive input of a sense amplifier 114 and to a negative input of a sense amplifier 116. A signal TREF HVT from the high voltage reference cell is sent to a negative input of the sense amplifier 114. A signal TREF LVT from the low voltage reference cell is sent to a positive input of the sense amplifier 116. The signal CMI is individually compared to the signal TREF HVT from the high voltage reference cell by the sense amplifier 114 and to the signal TREF LVT from the low voltage reference cell by the sense amplifier 116. An output ΔSA1 from the sense amplifier 114 is further connected to the sense amplifier 118 and an output ΔSA2 from the sense amplifier 116 is also further connected to the sense amplifier 118 for determining the state of the messy cell.

Figure 2:
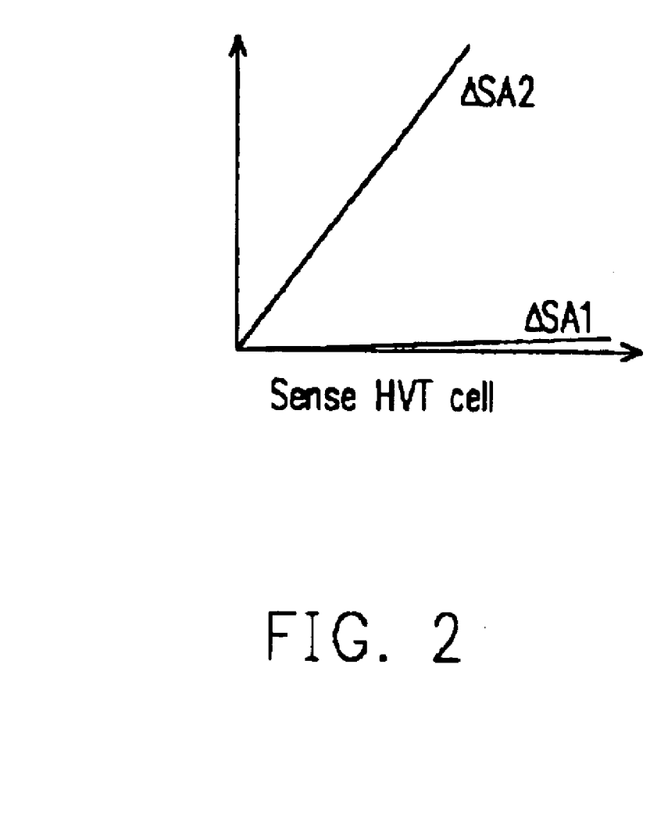
FIG. 2 is a voltage diagram of the high voltage cell of the dual reference cell sensing scheme according to a preferred embodiment of the present invention.
Figure 3:
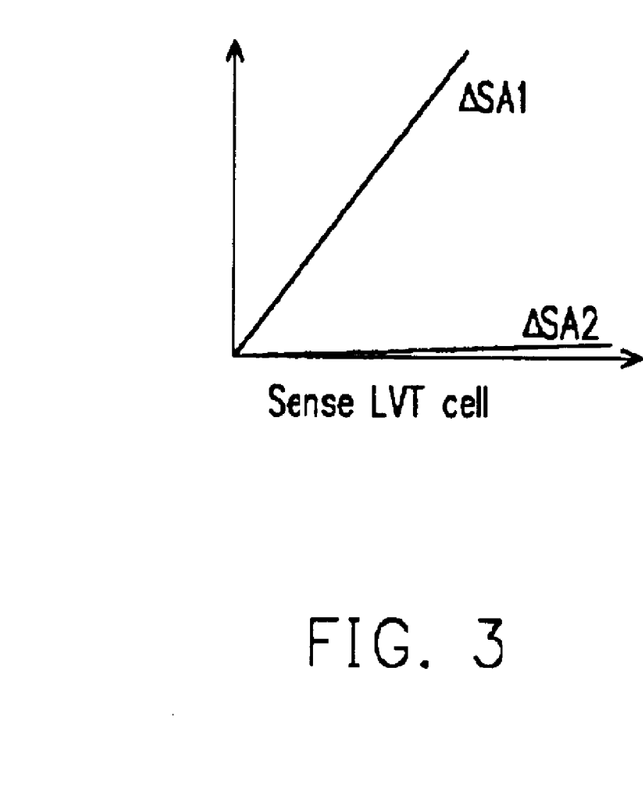
FIG. 3 is a voltage diagram of the low voltage ell of the dual reference cell sensing scheme according to a preferred embodiment of the present invention.

FIGS. 2 and 3 show a voltage diagram of the sense amplifiers 114 and 116 of FIG. 1 during operation of the non-volatile memory. The sense amplifier 114 compares the input signals CMI and TREF HVT and outputs a ΔSA1 according to the equation:

$$\Delta SA1 = Av \times (CMI - TREF\ HVT) \quad (3)$$

wherein Av represents an adjustable bias according to the sense amplifier 114 and ΔSA1 represents the change in voltage of the sense amplifier 114. Similarly, the sense amplifier 116 compares the input signals CMI and TREF LVT and outputs a ΔSA2 according to the equation:

$$\Delta SA2 = Av \times (TREF\ LVT - CMI) \quad (4)$$

wherein Av represents an stable bias according to the sense amplifier and ΔSA2 represents the change in voltage of the sense amplifier 116. The signals ΔSA1 and ΔSA2 are sent to the sense amplifier 118 for comparison to determine whether the voltage lies in the high or low voltage region. As shown in FIG. 2, while reading a HVT reference cell, an up branch sense a small difference in the ΔSA1 and a down branch senses a significant difference in the ΔSA2 and therefore the voltage will be pulled down by the sense amplifier 118 and the data is determined to be 1. Similarly shown in FIG. 3, the up branch senses a small difference in the −ΔSA2 and the down branch senses a significant difference in the ΔSA1 and therefor the vote will be pulled up by the sense amplifier 118 and the data is determined to be 1. The state of the memory cell is thereby determined in this dual reference cell sensing scheme of the present invention.

The read speed of the non-volatile memory is directly related to the ΔV of the sense amplifier. Although the output ΔV of the sense amplifier 118 can be adjusted by a bias Av in equation (3) and (4), the original sensing window cannot be expanded merely by adjusting bias Av and therefore the memory devices in prior art has limited usefulness in low voltage application. If the value of the bias Av is overlarge, no problem occurs and performance decreases in the single reference cell sensing scheme. The dual reference cell sensing scheme of the present invention increases the sensing window without the need of a large amplification. The bias Av can be adjusted to a minimum value so that natural noise immunity is high. Furthermore the dual reference cell sensing scheme is especially suitable for low voltage application because of the increased sensing window due to the increased ΔV. The following equation satisfies the increase in speed due to the increase in voltage:

$$\Delta V = \Delta I \times t \quad (5)$$

wherein, ΔV Is the change in voltage, ΔI is the change in current and t is the time. Therefore if the ΔV is increased, or doubled in the dual reference cell sensing scheme of the present invention, the time required to reach the same ΔI is decreased. Therefore the dual reference cell sensing scheme significantly improves read speed especially in low voltage application.

Figure 4:
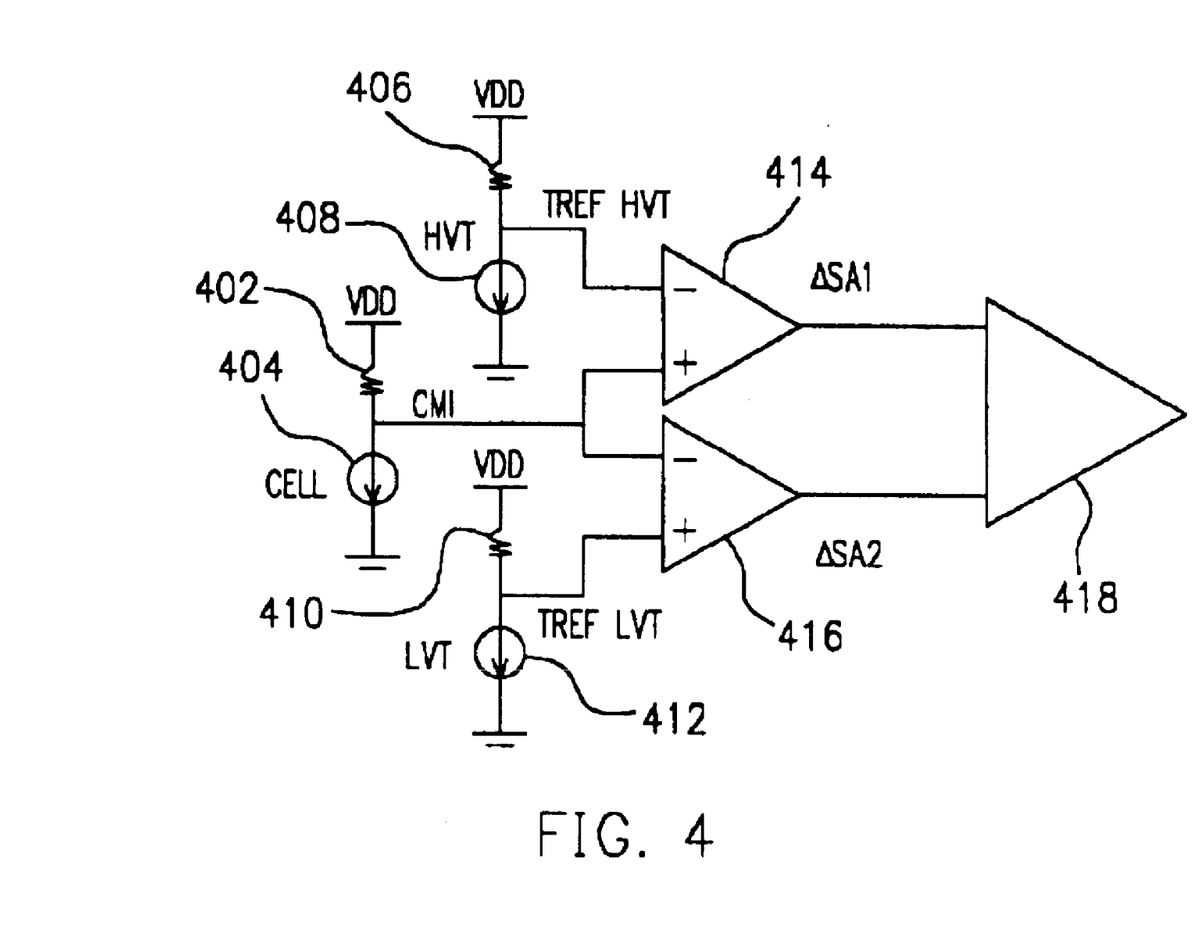
FIG. 4 is a schematic diagram of the voltage-based dual reference cell sensing scheme according to a preferred embodiment of the present invention.

FIG. 4 is an alternative embodiment of the present invention using in a voltage-based dual reference cell sensing scheme. Reference numerals 402, 406, and 410 denote a resistor connected to an operation voltage (VDD) of a memory cell, to a high voltage (HVT) reference cell, and to a low voltage (LVT) reference cell respectively. The resistors 402, 406, and 410 connected to VDD are individually coupled to current sources 404, 408, and 412 for converting the voltage into charges. The current source 404 generates a signal CMI to a positive input of a sense amplifier 414 and to a negative input of a sense ample 416. The HVT reference cell generates a signal TREF HVT to a negative input of the sense amplifier 414. The LVT reference cell generates a signal TREF LVT to a positive input of the sense amplifier 416. The output of the sense amplifiers 414 and 416 are sent to a sense amplifier 418 to determine the status of the memory cell by comparing the signals ΔSA1 and ΔSA2, respectively from the sense amplifiers 414 and 416. The equations for calculating ΔSA1 and ΔSA2 are the same as equations (3) and (4). The voltage diagrams of the voltage-based dual reference cell sensing scheme is identical to the current-based dual reference cell sensing scheme so FIG. 3 and FIG. 4 also apply to the voltage-based dual reference cell sensing scheme in FIG. 4.

Figure 5:
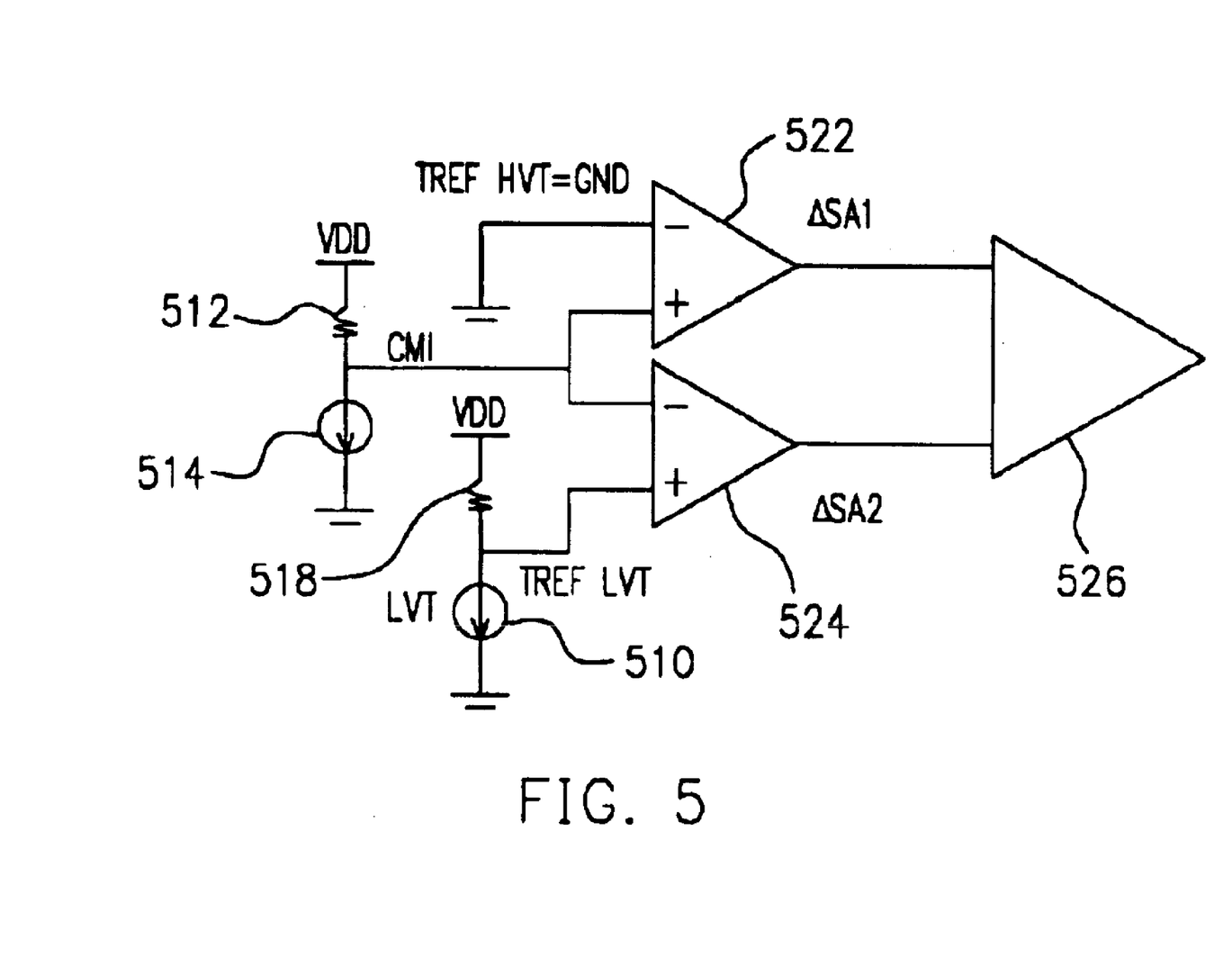
FIG. 5 is a schematic diagram of the voltage-based dual reference cell sensing scheme according to another preferred embodiment of the present invention.

FIG. 5 is an alternative embodiment of the present invention using ground as the high voltage reference cell. A resistor 512 and a current source 514 supply a potential to the memory cell and output a signal CMI. The signal CMI is then sent to a positive input of a sense amplifier 522 and to a negative input of the sense amplifier 524. The high voltage reference (HVT) cell is a ground signal coupled to a negative input of the sense amplifier 522. A resistor 518 connected to VDD and a current source 510 supply a potential to the low voltage reference cell and output a signal TREF LVT to a positive input of the sense amplifier 514. The output of the two sense amplifiers 522 and 524 are connected to inputs of a sense amplifier 526 to determine the status of the memory cell by comparing the signals ΔSA1 and ΔSA2. The equations for calculating ΔSA1 and ΔSA2 are the same as equations (3) and (4). The voltage diagrams of the voltage-based dual reference cell sensing scheme is identical to the current-based dual reference cell sensing scheme so FIG. 3 and FIG. 4 also apply to the voltage-based dual reference cell sensing scheme in FIG. 5.

Figure 6:
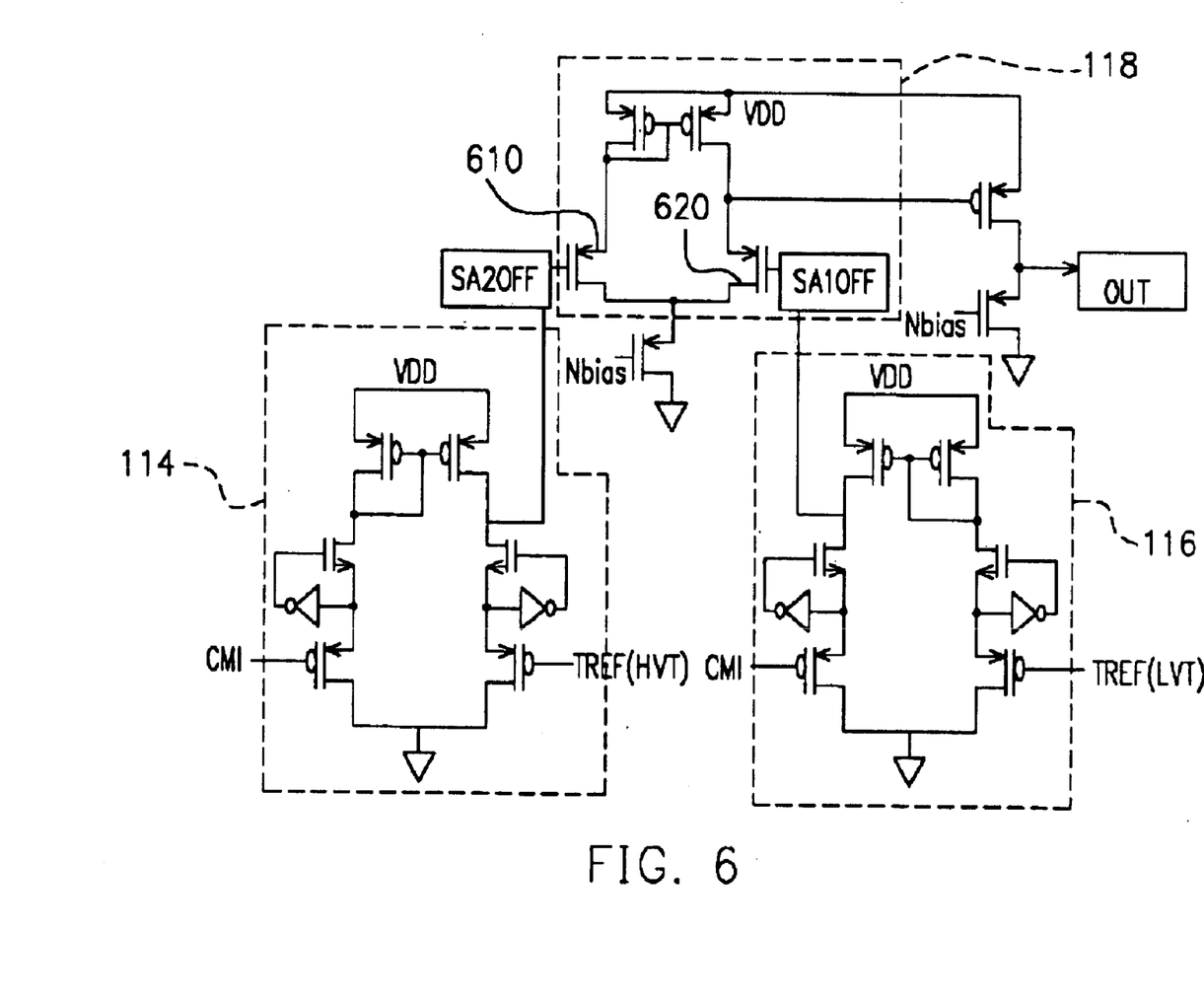
FIG. 6 is a circuit implementation of the voltage-based dual reference cell sensing scheme according to a preferred embodiment of the present invention.

FIG. 6 is a circuit implementation of the current-based dual reference cell sensing scheme in FIG. 1. Reference numeral 116 denotes the sense amplifier 116 which is coupled to the high voltage (HVT) reference cell and the memory cell in FIG. 1. Reference numeral 114 denotes the sense amplifier 114 which is coupled to low voltage (LVT) reference cell and the memory cell in FIG. 1. Some transistors are incorporated herein for controlling input signals of the sense amplifiers. The bias voltage levels of the sense amplifiers are predetermined in this embodiment. The output of the sense amplifiers 114 and 116 are connected to the sense amplifier 118 through two transistors 610 and 620, respectively. The sense amplifier 118 receives and compares the signals ΔSA1 and ΔSA2 to determine the signal SA1OFF or SA2OFF to switch off the input transistors of the sense amplifier 118. The final signal OUT determines if the data in the memory cell is 1 or 0.

Figure 7:
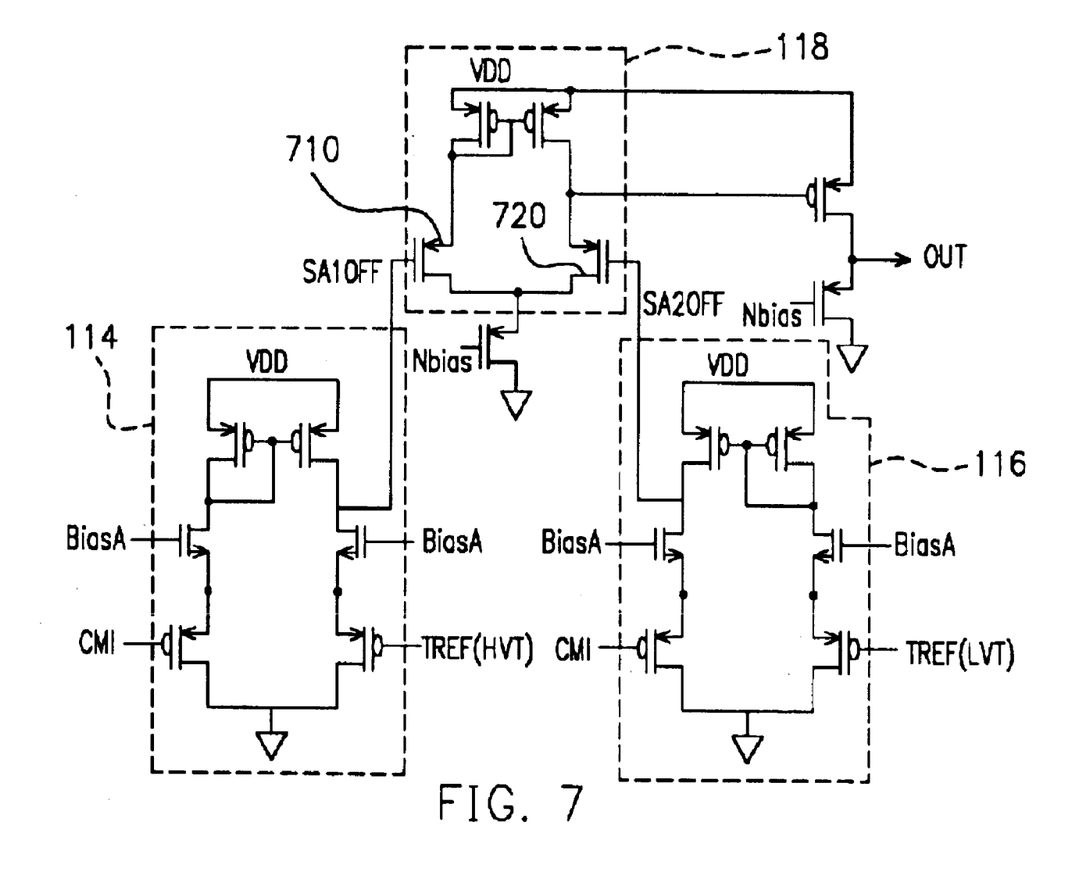
FIG. 7 is a circuit implementation of be voltage-based dual reference cell sensing scheme according to another preferred embodiment of the present invention.

FIG. 7 is a circuit implementation of the current-based dual reference cell sensing scheme with adjustable bias Av in FIG. 1. Reference numeral 116 denotes the sense amplifier 116 which is coupled to the high voltage (HVT) reference cell and the memory cell in FIG. 1. Reference numeral 114 denotes the sense amplifier 114 which is coupled to low voltage (LVT) reference cell and tee memory cell in FIG. 1. Some transistors are incorporated herein for control input signals of sense amplifiers. The bias Av of the sense amplifiers is adjustable in this embodiment. Each input signal of both sense amplifiers 114 and 116 can accept an adjustable bias Av value (the adjustable bias Av value is denoted as "BiasA" shown in the FIG. 7). The output of the sense amplifiers 114 and 116 are coupled to the sense amplifiers 118 through two transistors 710 and 720, respectively. The sense amplifier 118 receives and compares the signals ΔSA1 and ΔSA2 to determine the signal SA1OFF or SA2OFF to switch off the input transistors or the sense amplifier 118. The final signal OUT determines if the data in the memory cell is 1 or 0.

It will be apparent to those skilled in the art that various modifications and variations can be made to the structure and method of the present invention without departing from the scope or spirit of the present invention. In view of the foregoing description, it is intended that the present invention covers modifications and variations of this invention provided they fall within the scope of the following claims and their equivalents.

What is claimed is:

1. A high speed non-volatile memory device, comprising:
   at least one memory cell;
   a first reference cell;
   a second reference cell;
   a first sense amplifier coupled to the first reference cell and the memory cell for determining a voltage difference between the first reference cell and the memory cell;
   a second sense amplifier coupled to the second reference cell and the memory cell for determining a voltage difference between the second reference cell and the memory cell; and
   a third sense amplifier coupled to the first sense amplifier and the second sense amplifier for determining a status of the memory cell according to the voltage differences of the first sense amplifier and the second sense amplifier.

2. The device in claim 1, wherein the first reference cell comprises a current source and a capacitor for generating a first voltage reference signal.

3. The device in claim 1, wherein the second reference cell comprises a current source and a capacitor for generating a second voltage reference signal.

4. The device in claim 1, wherein the first reference cell comprises a current source and a resistor connected to VDD for generating a first voltage reference signal.

5. The device in claim 1, wherein the second reference cell comprises a current source and a resistor connected to VDD for generating a second voltage reference signal.

6. The device in claim 1, wherein the first reference cell is connected to ground and the second reference cell comprises a current source and a resistor connected to VDD for generating a first voltage reference signal.

7. The device in claim 1, wherein each of the first reference cell and the second reference cell is a single reference cell.

8. A high speed non-volatile memory device, comprising:
   at least one memory cell;
   a first reference cell comprising a current source and a capacitor;

a second reference cell comprising a current source and a capacitor;

a first sense amplifier coupled to the first reference cell and the memory cell for determining a voltage difference between the first reference cell and the memory cell;

a second sense amplifier coupled to the second reference cell and the memory cell for determining a voltage difference between the second reference cell and the memory cell; and a third sense amplifier coupled to the first sense amplifier and the second sense amplifier for determining a status of the memory cell according to the voltage differences of the first sense amplifier and the second sense amplifier.

9. The device in claim 8, wherein each of the first reference cell and the second reference cell is a single reference cell.

10. The device in claim 8, wherein the memory cell includes a current source and a capacitor.

11. A high speed non-volatile memory device, comprising:

at least one memory cell;

a first reference cell comprising a current source and a resistor connected to VDD;

a second reference cell comprising a current source and a resistor connected to VDD;

a first sense amplifier coupled to the first reference cell and the memory cell for determining a voltage difference between the first reference cell and the memory cell;

a second sense amplifier coupled to the second reference cell and the memory cell for determining a voltage difference between the second reference cell and the memory cell; and a third sense amplifier coupled to the first sense amplifier and the second sense amplifier for determining a status of the memory cell according to the voltage differences of the first sense amplifier and the second sense amplifier.

12. The device in claim 11, wherein each of the first reference cell and the second reference cell is a single reference cell.

13. A high speed non-volatile memory device, comprising:

at least one memory cell;

a first reference cell coupled to ground;

a second reference cell comprising a current source and a resistor connected to VDD;

a first sense amplifier coupled to the first reference cell and the memory cell for determining a voltage difference between the first reference cell and the memory cell;

a second sense amplifier coupled to the second reference cell and the memory cell for determining a voltage difference between the second reference cell and the memory cell; and a third sense amplifier coupled to the first sense amplifier and the second sense amplifier for determining a status of the memory cell according to the voltage differences of the first sense amplifier and the second sense amplifier.

14. The device in claim 13, wherein each of the first reference cell and the second reference cell is a single reference cell.

15. A method for sensing a non-volatile memory with dual reference cells, comprising:

providing first sense amplifier, a second sense amplifier, and a third sense amplifier, wherein each of the sense amplifiers has a first polarity input terminal and a second polarity input terminal;

applying a first voltage reference signal to the first polarity input terminal of the first sense amplifier, and a second voltage reference signal to the second polarity input terminal of the second sense amplifier;

applying a cell reference signal, which is to be sensed, to the second polarity input terminal of the first sense amplifier and the first polarity input terminal of the second sense amplifier, and leading outputs of the first sense amplifier and the second sense amplifier to the third sense amplifier.

16. The method of claim 15, wherein the first polarity input terminal is a negative input terminal and the second polarity input terminal is a positive input terminal.

17. The method of claim 15, wherein the first polarity input terminal is a positive input terminal and the second polarity input terminal is a negative input terminal.

18. The method of claim 15, wherein the first voltage reference signal is from a high voltage reference cell.

19. The method of claim 15, wherein the high voltage reference cell is a ground voltage, a floating ground, or a reference current source.

20. The method of claim 15, wherein the second voltage reference signal is from a low voltage reference cell.

* * * * *